United States Patent

Park et al.

[11] Patent Number: 5,933,379
[45] Date of Patent: Aug. 3, 1999

[54] METHOD AND CIRCUIT FOR TESTING A SEMICONDUCTOR MEMORY DEVICE OPERATING AT HIGH FREQUENCY

[75] Inventors: Churoo Park, Suwon; Soo-In Cho, Seoul, both of Rep. of Korea

[73] Assignee: Samsung Electronics, Co., Ltd., Suwon, Rep. of Korea

[21] Appl. No.: 09/052,053

[22] Filed: Mar. 30, 1998

Related U.S. Application Data

[63] Continuation-in-part of application No. 08/751,358, Nov. 18, 1996, abandoned.

[51] Int. Cl.⁶ .................................................. G11C 7/00
[52] U.S. Cl. ............................................ 365/201; 365/233
[58] Field of Search .................................. 365/201, 233, 365/189.01, 194; 371/21.1, 27.7, 61, 62

[56] References Cited

U.S. PATENT DOCUMENTS

| | | | |
|---|---|---|---|
| 5,570,381 | 10/1996 | Schofield | 365/201 |
| 5,757,705 | 5/1998 | Manning | 365/201 |
| 5,805,611 | 9/1998 | McClure | 371/27.7 |

Primary Examiner—Son Mai
Attorney, Agent, or Firm—Marger Johnson & McCollom, P.C.

[57] ABSTRACT

A circuit for testing a semiconductor memory device comprises a latency controller for controlling the latency of the external clock signal, an internal column address generator for generating a column address signal in the memory device, and a mode register for generating a mode signal. The circuit for testing semiconductor memory devices also includes a column address decoder for decoding the output address signal of the internal column address generator, a memory cell for reading or writing data, an input/output control unit for controlling the data input/output of the memory cell according to the output signal of the latency controller, a data input buffer, and a data output buffer. Further provided are a frequency multiplier for generating an internal clock signal having a frequency "n" times the frequency of the external clock signal. By providing the above-mentioned improvements, the conventional test equipment can be used to test high frequency memory devices.

8 Claims, 11 Drawing Sheets

5,933,379

METHOD AND CIRCUIT FOR TESTING A SEMICONDUCTOR MEMORY DEVICE OPERATING AT HIGH FREQUENCY

This is a continuation-in-part patent application of prior application Ser. No. 08/751,358 filed Nov. 18, 1996, now abandoned, of Churoo Park and Soo-In Cho entitled METHOD AND CIRCUIT FOR TESTING A SEMICONDUCTOR MEMORY DEVICE OPERATING AT HIGH FREQUENCY.

The present application is based on Korean Patent Application No. 41674/95, which is incorporated herein by reference.

BACKGROUND OF THE INVENTION

1. Field of the Invention

The present invention concerns a semiconductor memory device, and more particularly a circuit for testing a semiconductor memory device operating at a high frequency.

2. Description of the Related Art

Solid state memory devices have evolved in generally two directions: the first is to increase the memory density and the second is to increase the bandwidth, i.e., the operating speed, of the device. These two kinds of development require increased test time and improved test equipment thus increasing the cost of testing as well as degrading the test yield of the memory device.

Referring to FIG. 1, conventional test equipment comprises a mode register 10, a latency controller 20 for receiving an external clock signal CLK and the output of the mode register 10, and an internal column address generator 30 for receiving the external lock signal CLK, the output of the mode register 10, and the address Ai. The conventional test equipment shown in FIG. 1 also includes a column address decoder 40 synchronized with the external clock signal CLK for decoding the output signal CAi of the internal column address generator 30, a memory cell 50 for reading out or writing in data responsive to the output of the column address decoder 40, and an input/output control unit 60 for receiving the external clock signal CLK and the output latency CL of the latency controller 20 to control the data input/output of the memory cell. The data output buffer 70 receives the outputs of the input/output control unit 60 and latency controller 20 and transfers the output of the input/output control unit 60 having a certain level to the data input/output pin DQ. The data input buffer 80 transfers the data of the data input/output pin DQ to the data input/output control unit 60.

Such conventional test equipment is designed to test high density memory devices and can be modified slightly to test newly developed high density memory devices. However, the conventional test equipment shown in FIG. 1 is unsuited for testing high speed memory devices which ordinarily require specially designed test equipment having adequate bandwidth.

SUMMARY OF THE INVENTION

The present invention provides low bandwidth test equipment with a frequency multiplier which enables testing high bandwidth memory devices resulting in a reduction of the testing cost as well as an improvement in the test yield.

According to the present invention, a circuit for testing a semiconductor memory device is provided comprising a latency controller synchronized with an internal clock signal for generating a latency control signal, an internal column address generator synchronized with the internal clock signal for generating a column address signal responsive to an address signal, and a mode register for generating a mode signal applied to the latency controller and the internal column address generator. The circuit also includes a column address decoder for decoding the column address signal and a memory cell selected by the column address signal for reading or writing data. An input/output control unit controls the data input/output from the memory cell responsive to the latency control signal, a data input buffer stores data having a first predetermined voltage level in the memory cell, and a data output buffer retrieves data having a second predetermined voltage level from the memory cell. A frequency multiplier is also included in the circuit. The frequency multiplier receives an external clock signal and generates the internal clock signal having a frequency "n" times a frequency of the external clock signal. A test control unit generates the control signals necessary for controlling the frequency multiplier and the mode register.

By providing the above-mentioned improvements, low frequency conventional test equipment can be used to test high frequency memory devices.

BRIEF DESCRIPTION OF THE DRAWINGS

The above objects and advantages of the present invention will become more readily apparent by describing in detail a preferred embodiment thereof with reference to the attached drawings in which.

DETAILED DESCRIPTION OF THE PREFERRED EMBODIMENT

Figure 1:
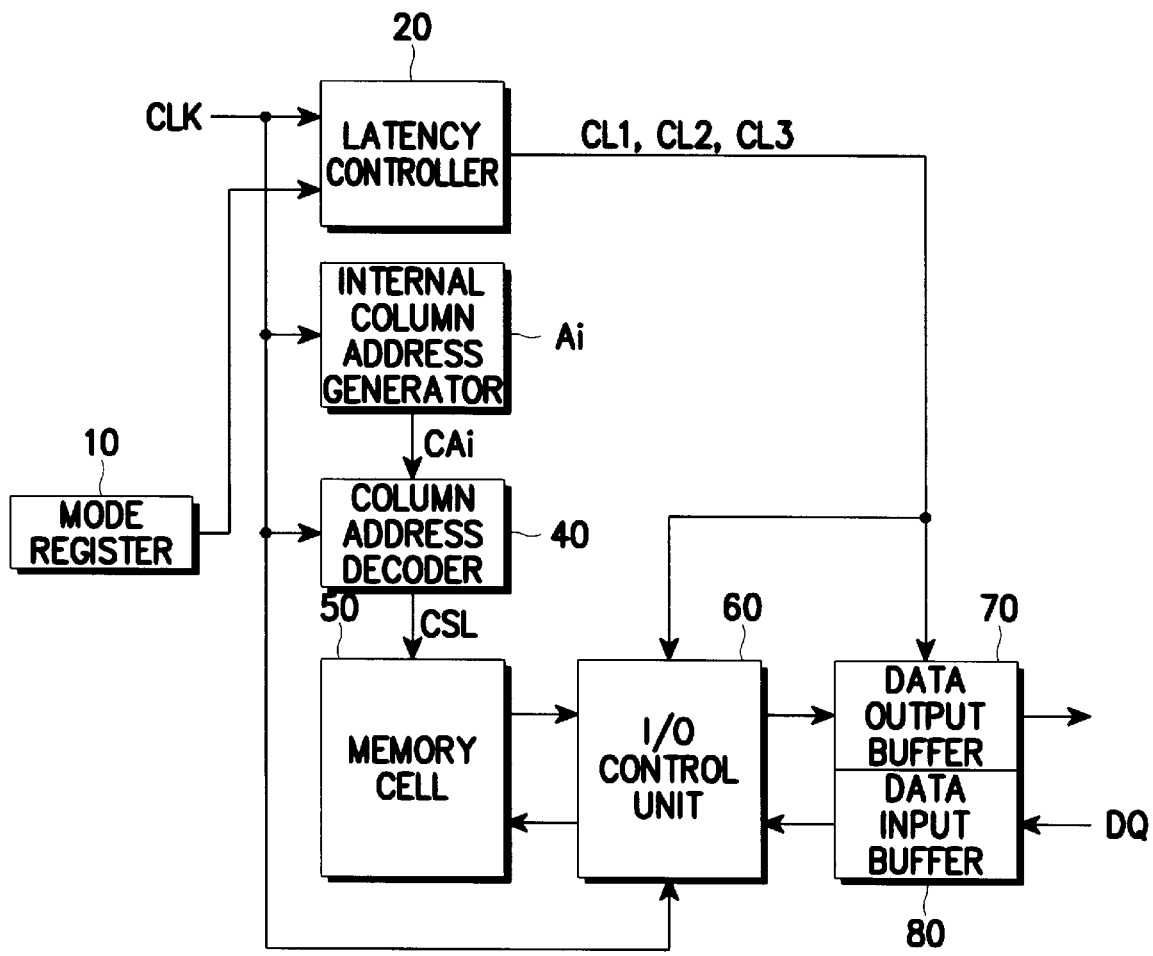
FIG. 1 is a block diagram of conventional test equipment for testing low speed memory devices.
Figure 2:
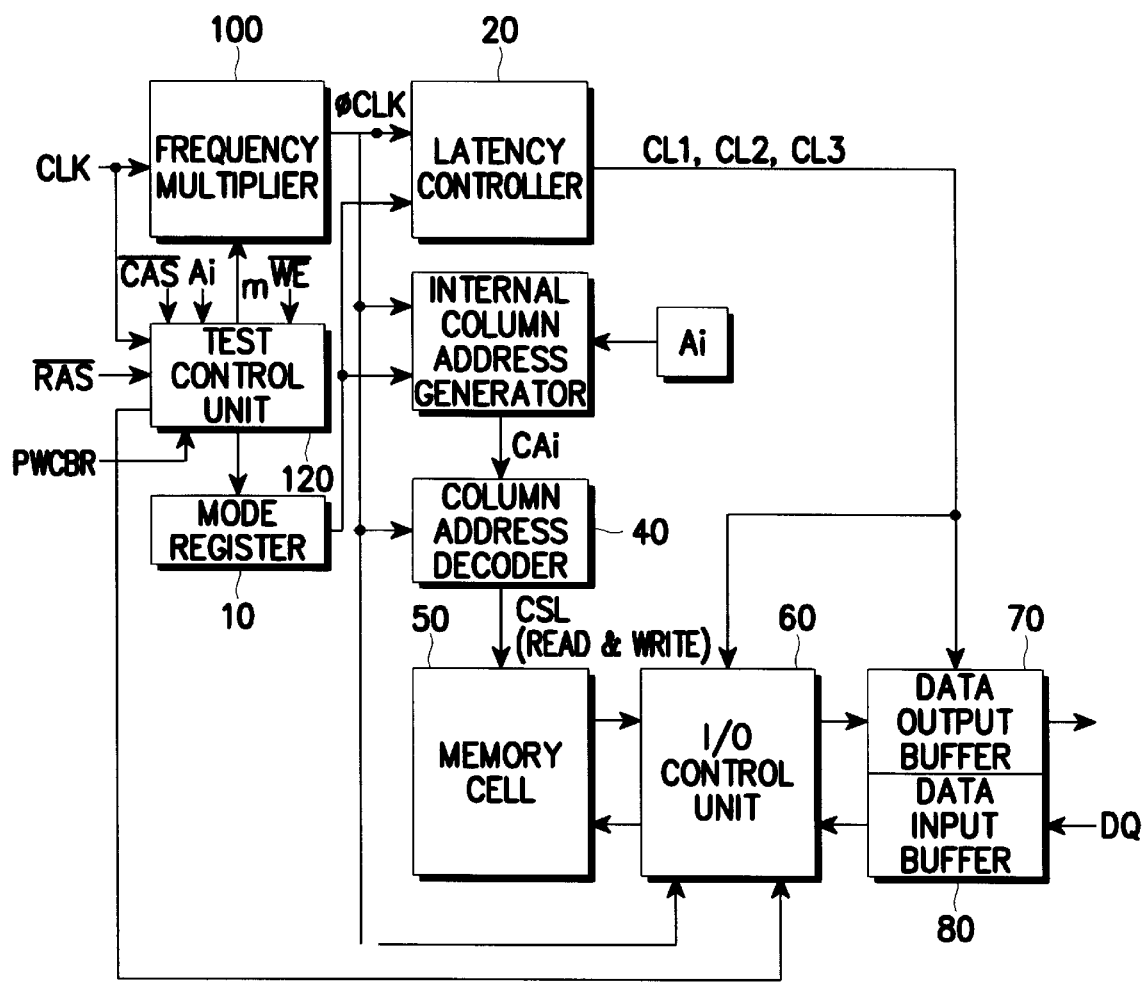
FIG. 2 is a block diagram of a preferred embodiment of the present invention.

According to the present invention, as shown in FIG. 2, there is provided a low bandwidth test equipment, such as shown in FIG. 1 with an additional frequency multiplier 100 and test control unit 120. The addition of the frequency multiplier 100 and the test control unit 120 enables testing of high speed memory devices with high bandwidth resulting in a reduced testing cost as well as an improved test yield. For example, testing the high bandwidth operation of a synchronous dynamic random access memory (SDRAM)

by using low bandwidth test equipment requires, firstly, the command and data input/output to be synchronized with the system clock signal. Secondly, the memory frequency is determined according to the column address strobe signal CAS latency CL (CL1=33 MHz, CL2=66 MHz, CL3=100 MHz) which determines what numbered clock is selected to retrieve the data. Thirdly, the data is sequentially inputted or outputted according to the burst read, burst write, and given burst length. Possible burst length may be 1, 2, 4, 8 or full page (the number is determined by the number of memory cells connected to one of the word lines (generally, this number is equal to 512)). The sequenced data is synchronized with the external clock signal CLK. Fourthly, the column address strobe signal latency and burst length are determined by storing and combining the key signals received through the address pin at a given timing into the internal register. These values are maintained until updated by the subsequent programmable timing or until the power is turned off. Namely, a single memory may be operated in various modes. Thus, the invention enables low bandwidth test equipment to generate a high frequency (multiple of the input clock frequency) clock signal in the memory device thereby reducing the testing cost.

Referring to FIG. 2, the inventive test equipment is achieved by additionally providing the conventional test equipment shown in FIG. 1 with a frequency multiplier 100, preferably employing a phase lock loop PLL and a delay lock loop DLL, and a test control unit 120.

FIG. 2 is a block diagram illustrating a test circuit according to the present invention where the external clock CLK is inputted through the frequency multiplier 100. the frequency multiplier 100 performs a frequency multiplication on the external clock signal CLK. Since the external clock CLK is as low as approximately 33 $MH_z$, the frequency of the clock signal CLK is multiplied by performing a frequency multiplication of the internal clock signal CLK resulting in the multiplied clock signal ΦCLK equal to 66 $MH_z$ and 100 $MH_Z$. Thus, the frequency-multiplied clock signal ΦCLK is inputted to the latency controller 20, the column addresses are outputted according to the multiplied clock signal ΦCLK, and the column selection signal is enabled. Accordingly, the data is inputted to or outputted from the device.

Therefore, as shown in FIG. 2, the input/output of data is determined as each address and column address is synchronized according to the internal clock ΦCLK generated in the frequency multiplier 100.

Figure 3A:
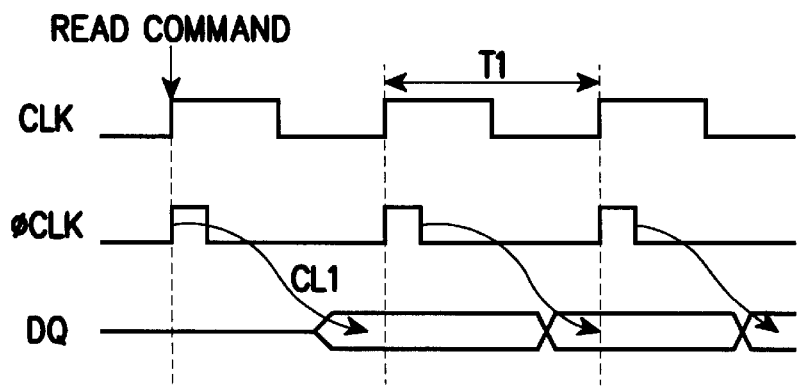
FIGS. 3A, 3B and 3C are waveform diagrams of clock signal combinations for testing high frequency semiconductor memory devices according to the present invention.

FIG. 3A is an operation timing diagram showing the steps necessary for reading data. In FIG. 3A, the frequency of the internal clock signal ΦCLK, generated in the frequency multiplier 100 of FIG. 2, is equal to the external clock signal CLK.

Figure 3B:
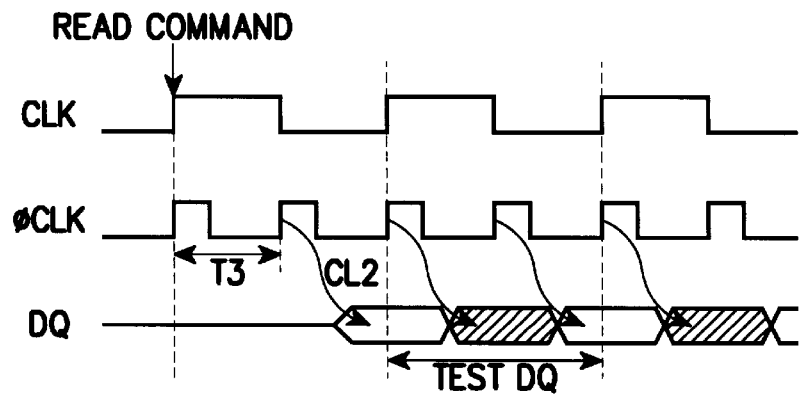

FIG. 3B is a timing diagram showing a test time point of a data input/output and testing DQ where the frequency of the internal clock signal ΦCLK, generated in the frequency multiplier 100 of FIG. 2, is twice that of the external clock CLK, that is, when the internal clock ΦCLK is equal to 66 $MH_z$.

Figure 3C:
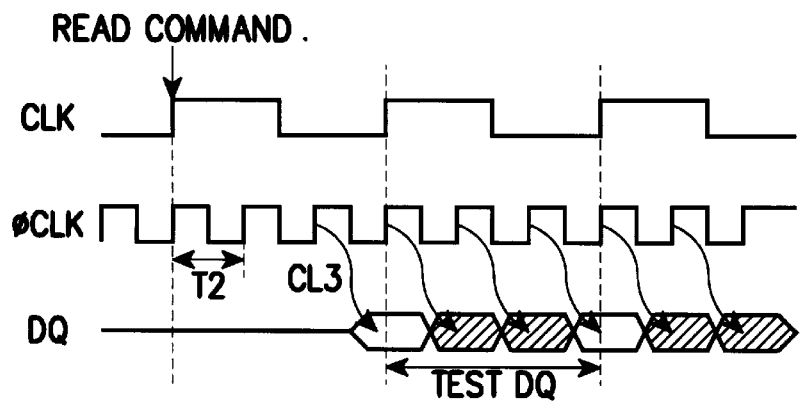

FIG. 3C is a timing diagram showing a test time point of a data input/output and testing DQ where the frequency of the internal clock ΦCLK is three times that of the external clock CLK, that is, when the internal clock ΦCLK is equal to 100 $MH_z$.

For the column address strobe signal latency CL1, the maximum frequency is 33 MHz, as shown in FIG. 3A, so that the testing is conducted at a maximum of 33 MHz.

However, for CL2=66 MHz and CL3=100 MHz, the test equipment needs to have the bandwidth to test such frequencies. This problem is resolved by employing the frequency multiplier 100 of FIG. 2, which multiplies the frequency of the control clock ΦCLK by 2 or 3 times for an address strobe signal latency CL2 or CL3, respectively, so as to make the memory device internally operate in the same manner as with the cases of 66 MHz and 100 MHz and testing the data output from the memory cell at the rising edge of the external clock CLK. In this case, the data output pin DQ generates 66 MHz or 100 MHz data but it is ignored. However, a suitable address scramble may be made to test the signal of the data output pin DQ of the cell, as shown in FIG. 4.

Figure 4:
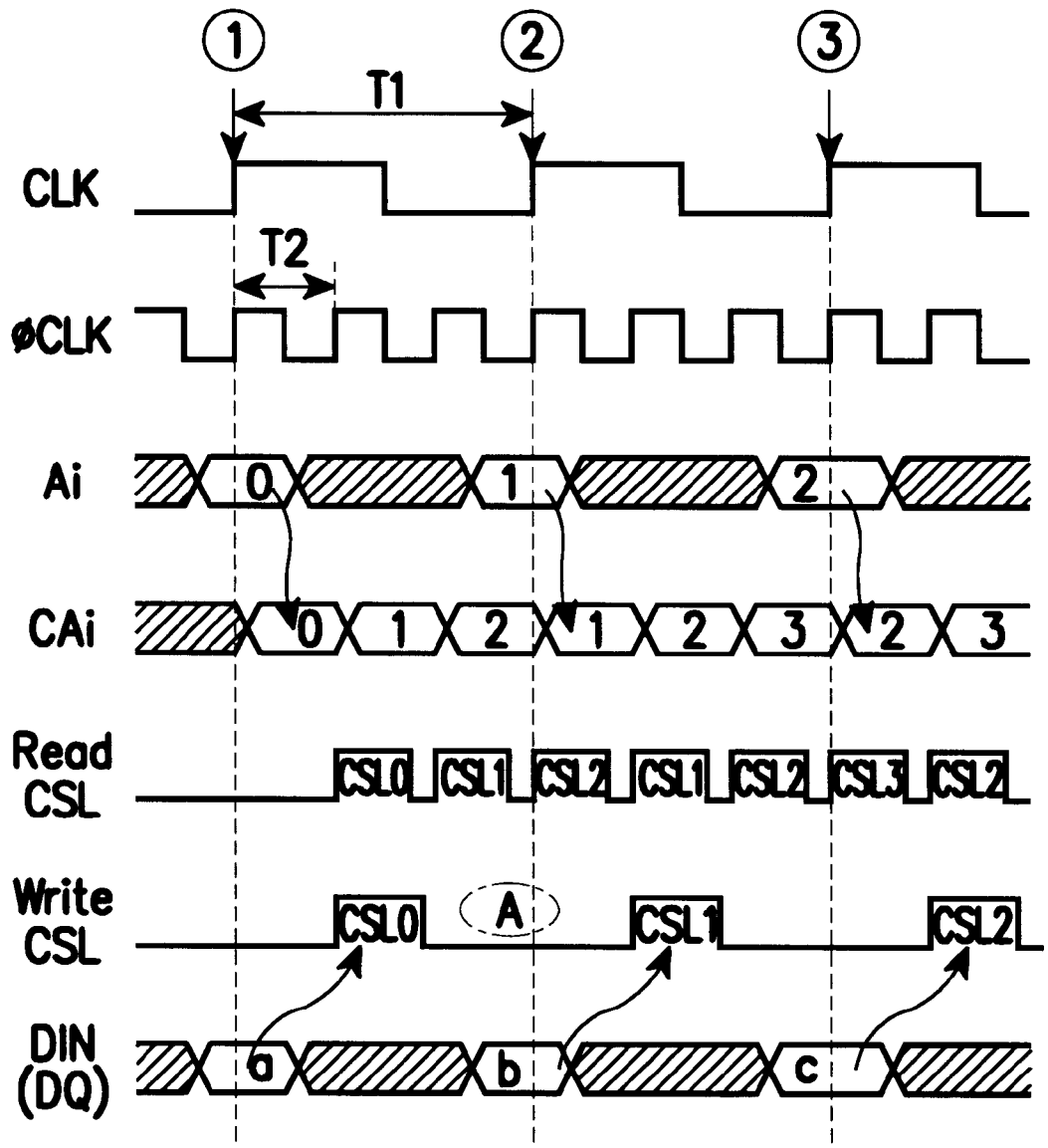
FIG. 4 is a timing diagram of the signals used for controlling the column selection line when writing in the test mode.

FIG. 4 is a timing diagram showing a write operation when the internal clock ΦCLK is equal to 100 $MH_z$. Also, unlike read operation, when the invalid data is inputted, there is a potential conflict generated upon write operation. For this reason, a test column selection line CSL is selected among each of the column selection lines, CSL1, CSL2, and CSL3, and the rest of the column selection lines thereamong are disabled, whereby the test operation of an external clock signal CLK equal to 33 $MH_z$ is performed with an internal clock signal ΦCLK equal to 100 $MH_z$. T1 represents a single period of the external clock signal CLK and T2 a single period of the internal clock signal ΦCLK. Therefore, in FIG. 4, the period of the internal clock ΦCLK is one third as long as that of the external clock signal CLK. T1 represents the case that the multiplication factor m is 1 with the same period of the internal clock ΦCLK as that of the external clock CLK. T2 represents the case that the multiplication factor m is 2 with the internal clock ΦCLK having a period one third as long as that of the external clock CLK. T3 represents the case that the multiplication factor m is 3 with the internal clock ΦCLK having a period half as long as that of the external clock CLK.

Symbols 1, 2, and 3 of FIG. 4 represent each rising edge per one period of the external clock signal CLK. In this case, a data input signal DIN(a,b . . . ) is inputted from the data output pin DQ of each rising edge of the device.

Referring to FIG. 4, as each clock read or write command is given to increase the address one by one at 33 MHz, the memory device internally operates at 100 MHz, so that two additional column addresses are internally generated for one cycle (30 ns) of 33 MHz to increase the address as 0-1-2, 1-2-3, 2-3-4. The data output pin DQ generates output signals respectively for the three column addresses under the output condition of 100 MHz although the hatched data shown in the drawing is not tested during that period. In case of data read, the object is achieved by increasing the internal operating frequency of the device, but, in case of data write, two of the column selection lines CSL (one in the 66 MHz test) are disabled to prevent invalid writing as shown by reference symbol "A". However, the first CSL in the write mode has the same interval of logic "high" under the 100 MHz and 33 MHz operating condition. In case of multi-data output memory, it is possible to receive data in parallel and write in series in conformity with the internally increased frequency, as shown in FIGS. 5A and 5B.

Figure 5A:
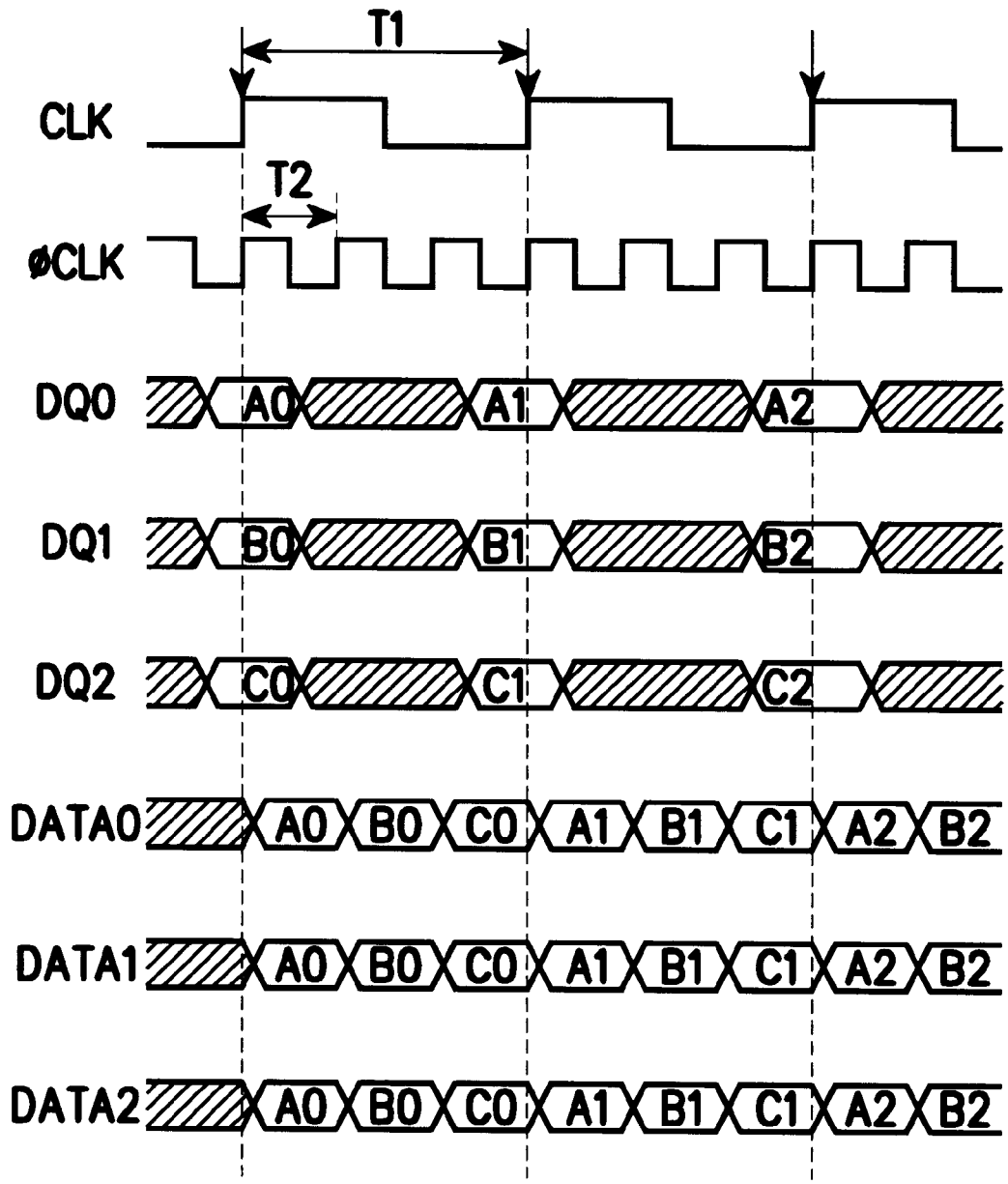
FIGS. 5A and 5B are timing and block diagrams illustrating data scrambling in the multi-data output.

FIG. 5A is a diagram illustrating the data scrambling method for outputting the multi-data. When there are a number of data output pins DQ0, DQ1, and DQ2, data synchronized to the internal clock ΦCLK under each different condition and inputted in parallel by each output pin, outputted in series through a data multiplexer and then to be transmitted to the input/output control until 60 of FIG. 2.

Figure 5B:
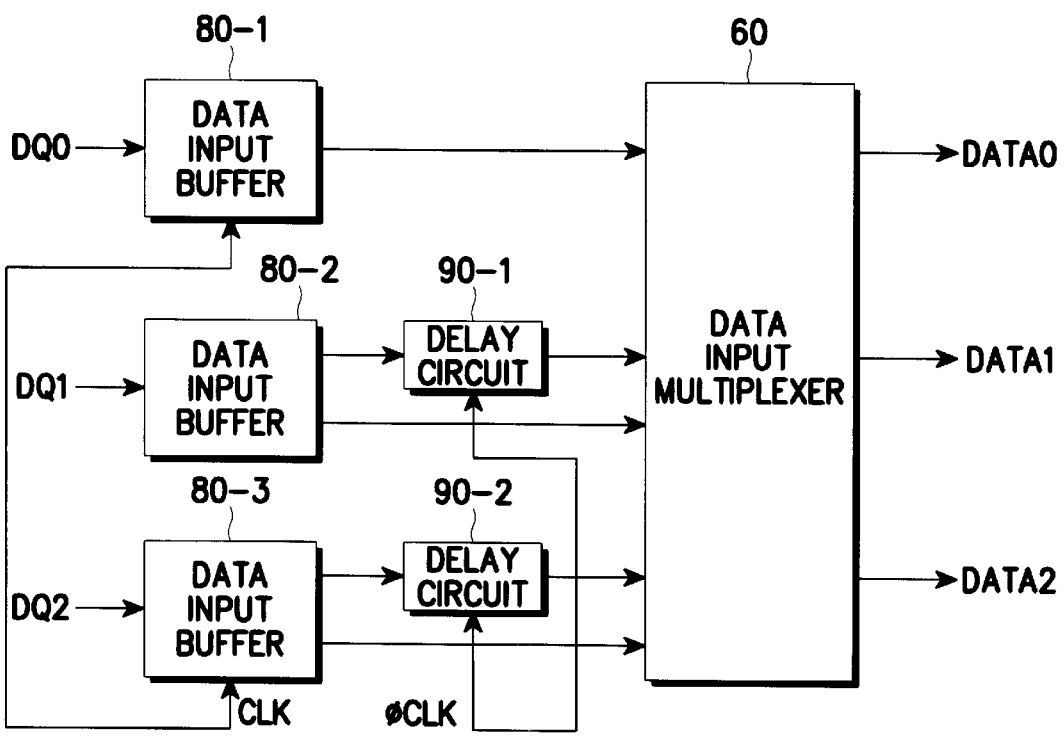

FIG. 5B is a block diagram showing output circuitry for implementing the steps of FIG. 5A. The circuit of FIG. 5B comprises a data input buffer (80-1) for buffering the data of the data output pin DQ0 in order to perform normal read and write operation, through input of the external clock CLK; data input buffers (80-2) and (80-3) for respectively buffering the data of data output pins DQ1 and DQ2; delay circuits (90-1) for inputting the output of the data input buffers (80-2), delaying the data of the data output pin DQ1 through the internal clock ΦCLK synchronized by the external clock CLK for predetermined time and, inputting the data of the data output pin DQ1 to the data input multiplexer; delay circuits (90-2) for inputting the output of the data input buffers (80-3), delaying the data output pin DQ2 by the internal clock ΦCLK for predetermined time, and inputting the data of the data output pin DQ2 to the data input multiplexer. Through said data input multiplexer, input/output multiplier 60 serially outputs data signals DATA0, DATA1, and DATA2.

Figure 6A:
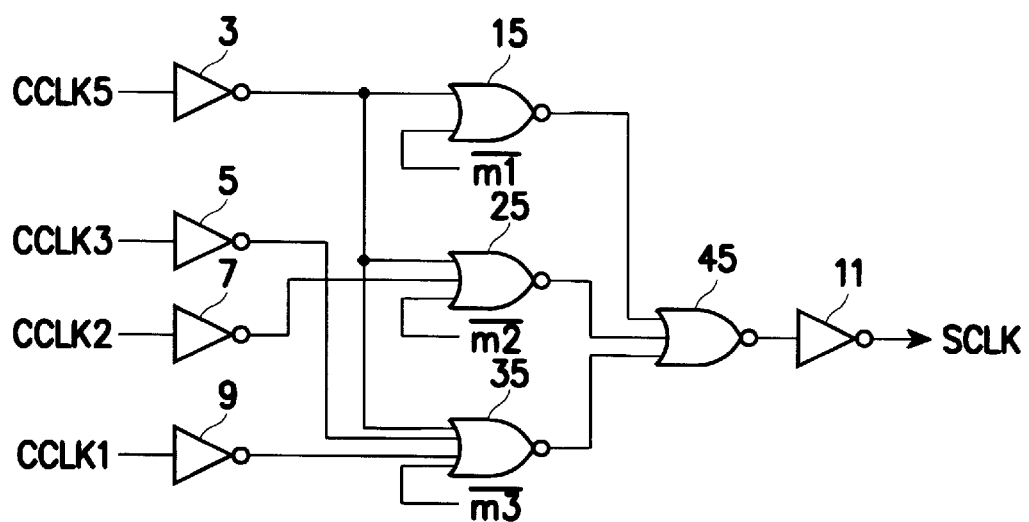
FIGS. 6A, 6B and 6C are block diagrams of the frequency multiplier circuit 100 employing a DLL according to another embodiment of the present invention.
Figure 6B:
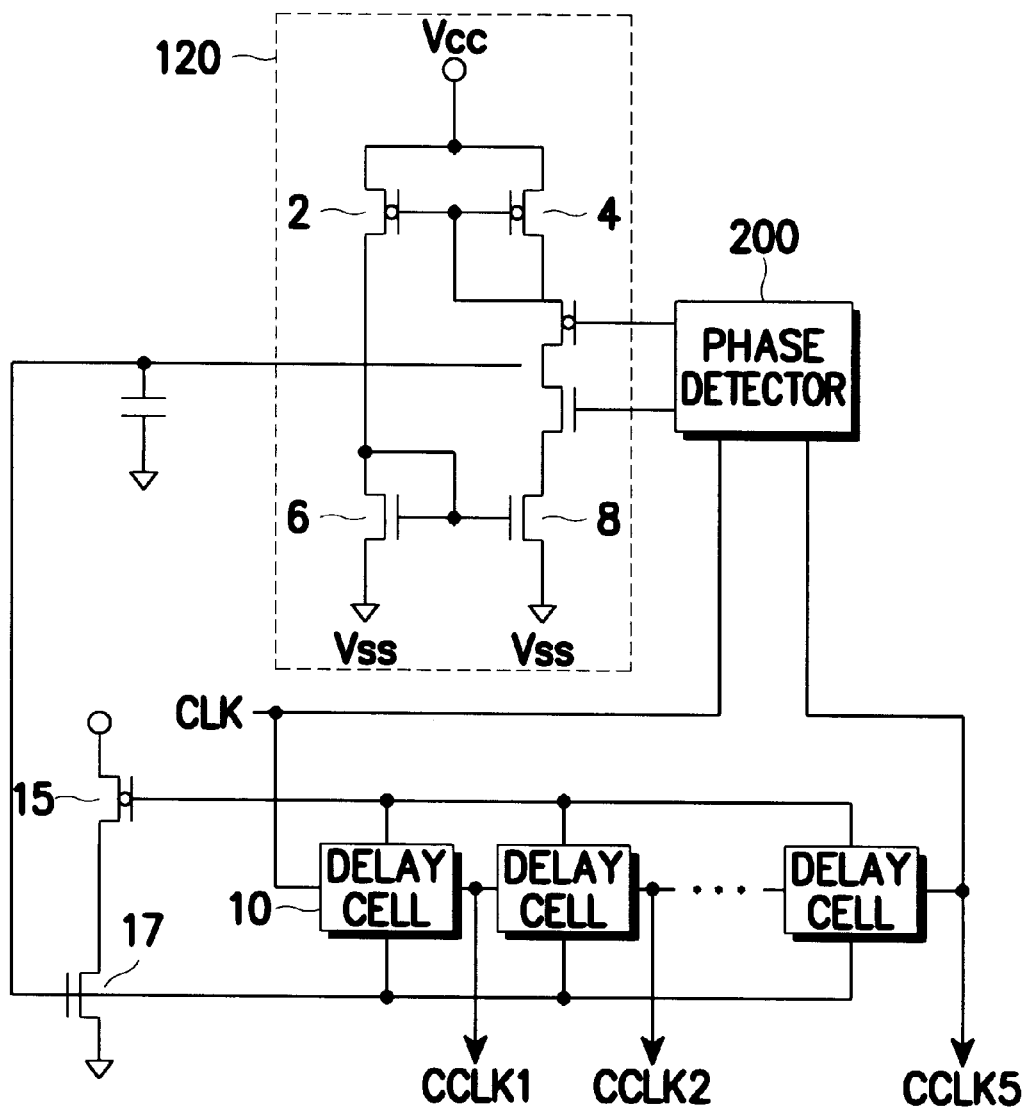

Referring to FIGS. 6A and 6B, the frequency may be increased by two or three times by the frequency divided output clock signals CCLK1–5. The control clock ΦCLK is generated by employing CCLK5 during normal operation, CCLK2 and CCLK5 for increasing the frequency by two, and CCLK1, CCLK3 and CCLK5 for increasing the frequency by three times. This test mode is obtained by the logic "high" state of the address A7P of the conventional WCBR test mode, where the value of the multiplication factor is determined by using the addresses A1, A2, and A3. The multiplication factor m is always set to a value equal to 1 except during the test mode. Thus, if a low frequency is applied to the device, a high frequency clock (two or three times) is generated in the device to test the high frequency characteristics.

Figure 6C:
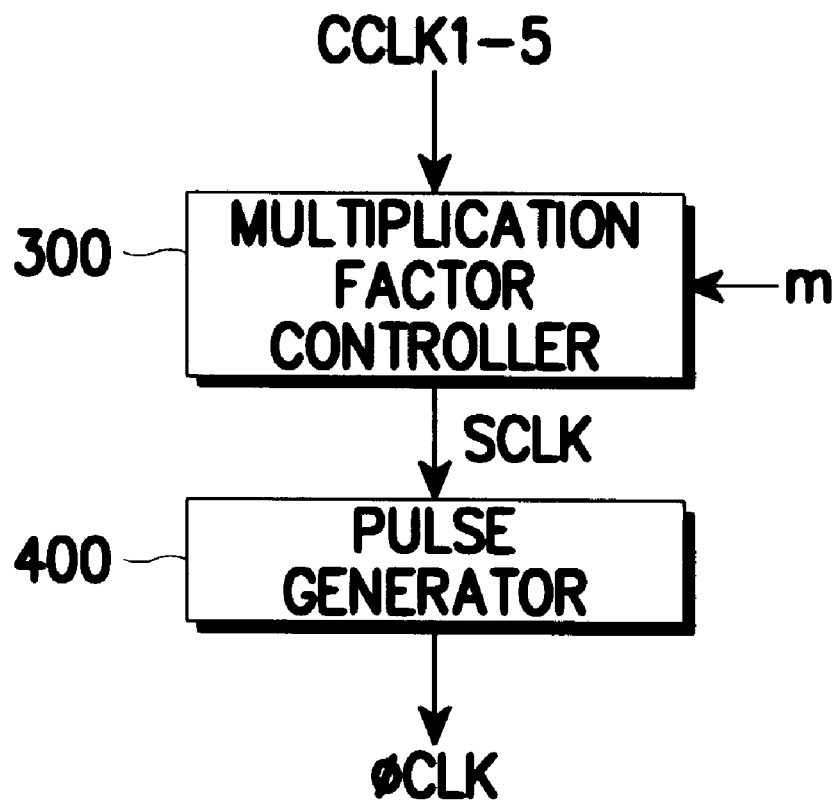

In FIG. 6C, the internal clock signal ΦCLK is generated in response to clock signals CCLK1, CCLK2, and CCLK5 and is outputted to the latency controller 20, the internal column address generator, the column address decoder 40, and the input/output unit 60.

Figure 7A:
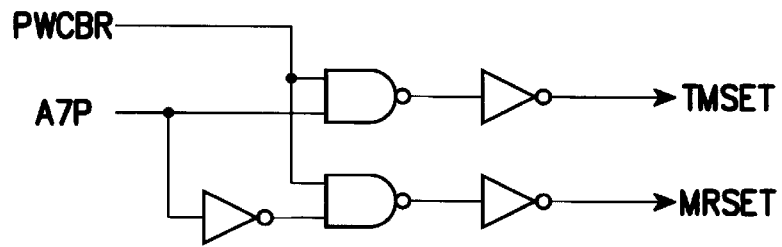
FIG. 7A is a circuit diagram of the master control pulse generator included the test control unit 120 shown in FIG. 2.
Figure 7B:
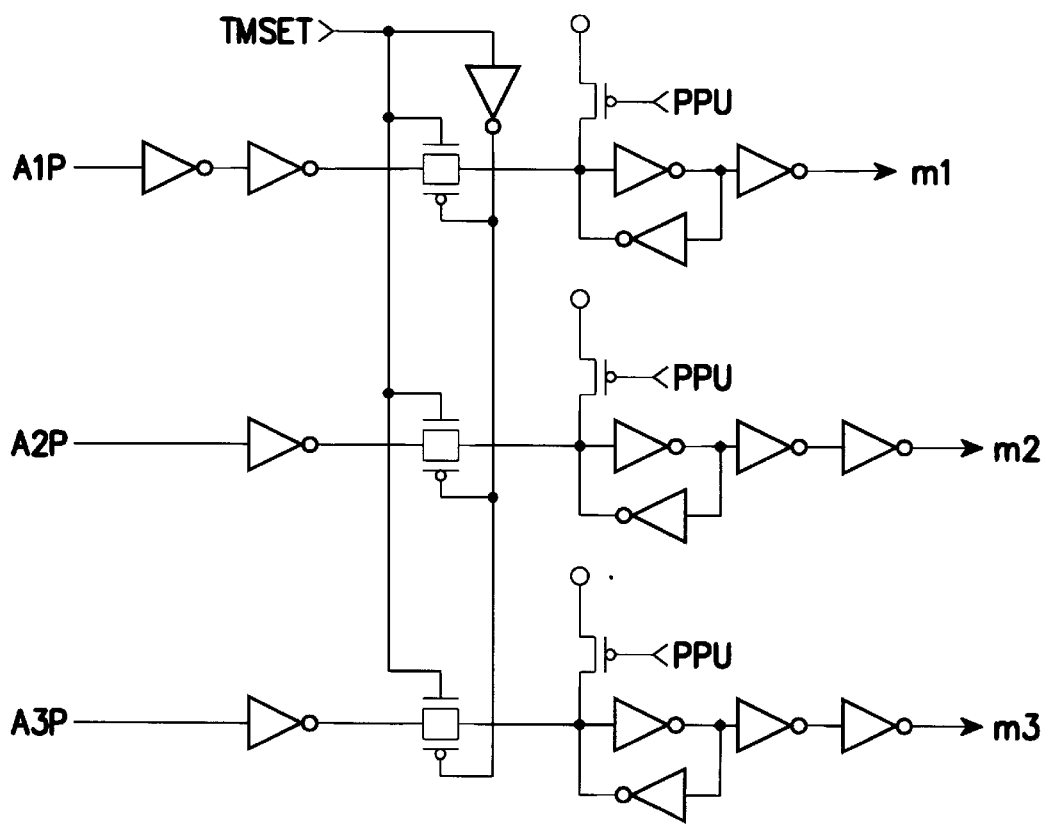
FIG. 7B is a circuit diagram of the frequency control signal generator included in the test control unit 120 shown in FIG. 2.
Figure 7C:
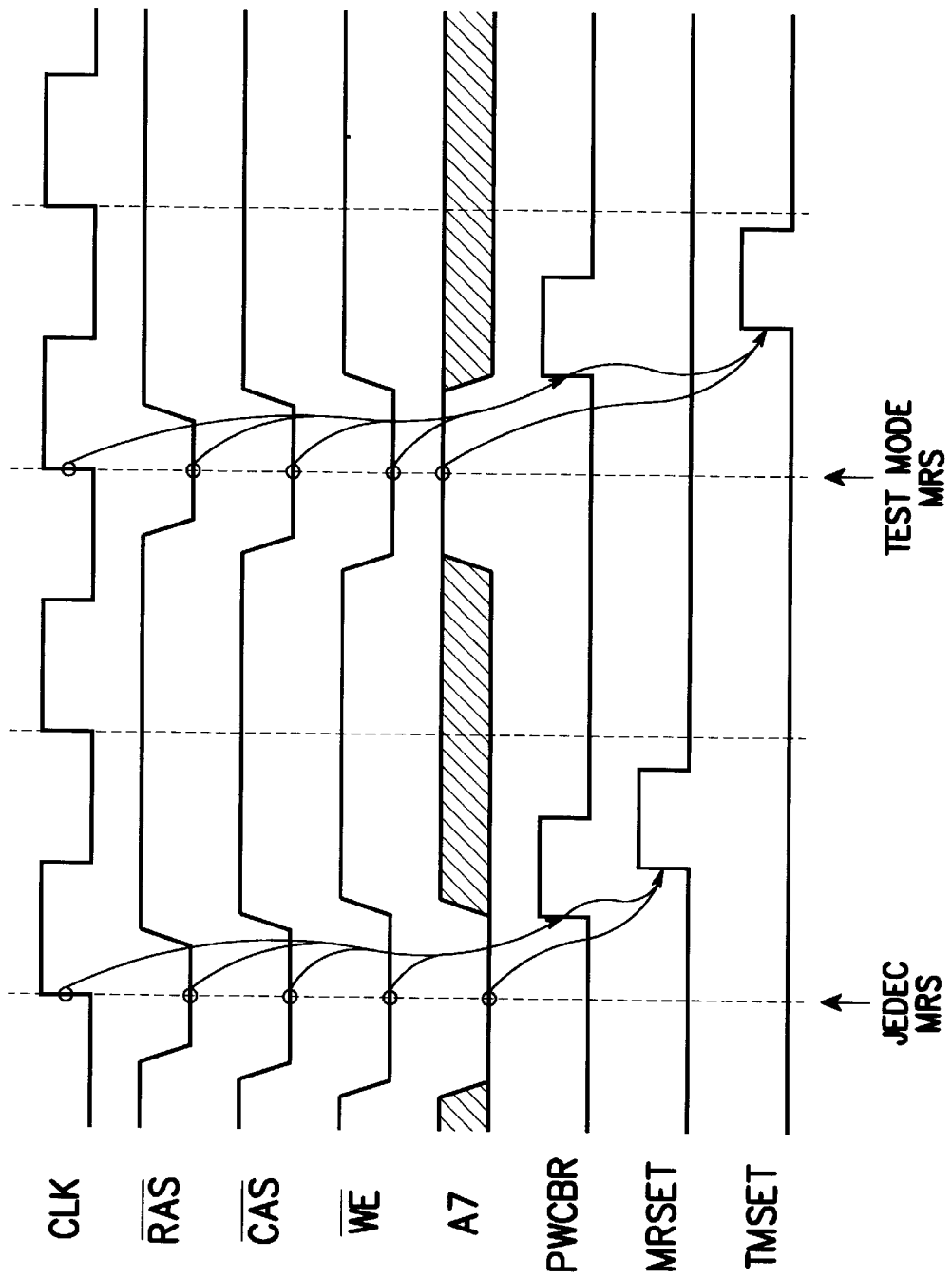
FIG. 7C is a timing diagram of the signals necessary to generate the test mode set signal TMSET shown in FIGS. 7A and 7B.

The multiplication factor "m" is determined according to the control signals generated from the test control unit 120. A detailed circuit diagram of the test control circuit 120 is illustrated in FIGS. 7A and 7B. A timing diagram of the signals related to the generation of the test mode set signal TMSET is illustrated in FIG. 7C. The test control unit 120 includes a master control pulse generator shown in FIG. 7A and a frequency control signal generator shown in FIG. 7B.

The master control pulse generator shown in FIG. 7A operates as follows. The master control pulse generator generates the test mode signal TMSET and the output signal MRSET as shown in FIG. 7C. Referring to FIG. 7C, when the row address strobe signal RAS, the column address strobe signal CAS, and the write enable signal WE are at a logic low state at the rising edge of external the clock signal CLK (called the WCBR mode), the master signal PWCBR for controlling the states of the mode registers in the device is generated. The internal address signal A7P is input together with the master signal PWCBR. A WCBR mode command is applied to the NAND gates of the master control pulse generator of FIG. 7A. The master control pulse generator generates two output signals MRSET and TMSET, one of which is selectively enabled according to the logic state of the address signal A7P. The output signal MRSET controls the mode register for determining the operating mode of the SDRAM, for example, for determining CAS latency, burst length, and burst type.

The output signal TMSET controls various test mode registers prepared for the device test by the manufacturer. In one embodiment, when the master signal PWCBR and the address signal A7P are both set at a logic high state, the test mode signal TMSET is enabled to a logic high state.

The test mode signal TMSET switches transmission gates on and off in the frequency control signal generator shown in FIG. 7B. Referring to FIG. 7B, the frequency control signal generator generates output signals m1, m2, and m3 whose logic states are determined according to the logic states of the input signals A1P, A2P, and A3P. The input signals A1P, A2P, and A3P refer to the internal signals provided at the external address pins A1, A2, and A3 of the device under test. It is possible to change the internal frequency to a desired frequency, even though the frequency of the external clock is not hanged during the test, by enabling the test mode set signal TMSET and appropriately controlling the external addresses A1, A2, and A3. In this case, a default setting should be performed since the test mode set signal TMSET is enabled in the manufacturing process prior to shipment of the product. For that reason, the frequency control signal generator includes PMOS transistors each having a source connected to the power supply voltage and a gate connected to a power-up detection signal PPU.

The power-up detection signal PPU is maintained at a logic low state when the power supply is lower than a preset voltage level and changes to a logic high state when the power supply voltage is higher than the preset voltage level. Upon power-up, the power supply voltage increases gradually. Thus, the power-up detection signal PPU maintains a logic low state initially latching the output signals m1, m2, and m3 of the frequency control signal generator to a logic high, low, and low states, respectively. These logic states are maintained even though the power supply voltage increases to a steady state level that is higher than the preset voltage level because the power-up detection signal PPU changes to a logic high state. Therefore, in the normal operating state after shipment of the product, the external frequency becomes coincident with the internal frequency.

Having illustrated and described the principles of the invention in a preferred embodiment thereof, it should be readily apparent to those skilled in the art that the invention can be modified in arrangement and detail without departing from such principles. We claim all modification coming within the spirit and scope of the following claims.

What is claimed is:

1. A circuit for testing a semiconductor memory device, comprising:

a latency controller synchronized with an internal clock signal for generating a latency control signal;

an internal column address generator synchronized with the internal clock signal for generating a column address signal responsive to an address signal;

a mode register for generating a mode signal applied to the latency controller and the internal column address generator;

a column address decoder for decoding the column address signal;

a memory cell selected by the column address signal for reading or writing data;

an input/output control unit for controlling the data input/output from the memory cell responsive to the latency control signal;

a data input buffer for storing data having a first predetermined voltage level in the memory cell;

a data output buffer for retrieving data having a second predetermined voltage level from the memory cell;

a frequency multiplier for receiving an external clock signal and generating the internal clock signal having a frequency "n" times a frequency of the external clock signal; and a test control unit for generating control signals necessary for controlling the frequency multiplier and the mode register.

2. A circuit according to claim 1 wherein the input/output control unit includes a data input multiplexer having at least two of the data input buffers for inputting at least two data signals to the multiplexer.

3. A circuit according to claim 2 wherein a first of the at least two data signals is clocked into the multiplexer according to the external clock signal.

4. A circuit according to claim 2 wherein a second of the at least two data signals is clocked into the multiplexer according to the internal clock signal.

5. A circuit according to claim 4 including a delay circuit coupling the second data signal into the multiplexer.

6. A circuit according to claim 1 wherein the frequency multiplier includes:

a clock divider circuit having the external clock signal as an input and at least four outputs including a first output corresponding to the external clock signal, a second delayed output, and third and fourth delayed outputs; and a multiplication factor controller for outputting a selected one of:

a) the first output at the frequency of the external clock;

b) the first output and second, delayed output combined to a frequency of twice the frequency of the external clock; and c) the first output and the third and fourth delayed outputs combined to a frequency of three times the frequency of the external clock frequency.

7. A circuit according to claim 1 wherein the semiconductor memory device has multi-data input/output, the circuit including;

means for synchronizing parallel input data with internally increased frequency of the memory device to multiple data in series; and means for collecting data generated in synchronism with the multiple data to output in parallel.

8. A circuit according to claim 1 wherein the test control unit includes:

a master control pulse generator for generating a mode register set signal and a test mode set signal responsive to a master signal; and a frequency control signal generator for generating a frequency control signal responsive to the test mode set signal.

* * * * *

UNITED STATES PATENT AND TRADEMARK OFFICE
CERTIFICATE OF CORRECTION

PATENT NO. : 5,933,379
DATED : August 3, 1999
INVENTOR(S) : Park et al.

Page 1 of 1

It is certified that error appears in the above-identified patent and that said Letters Patent is hereby corrected as shown below:

Column 3,
Line 34, "33MH$_z$" should read -- 33MHz --;
Lines 37 and 38, "66MH$_z$ and 100MH$_z$" should read -- 66MHz and 100MHz --;
Line 59, 66MH$_z$" should read -- 66MHz --;

Column 4,
Line 16, "100MH$_z$" should read -- 100MHz --;
Line 22, "33MH$_z$" should read -- 33MHz --;
Line 23, "100MH$_z$" should read -- 100MHz --;

Column 6,
Line 14, "not hanged" should read -- not changed --.

Signed and Sealed this

Twenty-eighth Day of May, 2002

Attest:

Attesting Officer

JAMES E. ROGAN
*Director of the United States Patent and Trademark Office*